(12) United States Patent
Song et al.

(10) Patent No.: US 11,217,767 B2
(45) Date of Patent: Jan. 4, 2022

(54) ORGANIC LIGHT EMITTING DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 60 days.

(21) Appl. No.: 16/490,863

(22) PCT Filed: Mar. 18, 2019

(86) PCT No.: PCT/CN2019/078564
§ 371 (c)(1),
(2) Date: Sep. 3, 2019

(87) PCT Pub. No.: WO2019/205834
PCT Pub. Date: Oct. 31, 2019

(65) Prior Publication Data
US 2021/0013445 A1    Jan. 14, 2021

(30) Foreign Application Priority Data

Apr. 24, 2018 (CN) .......................... 201810373842.X (51) Int. Cl.
*H01L 51/52* (2006.01)
*H01L 27/32* (2006.01)
*H01L 51/56* (2006.01)

(52) U.S. Cl.
CPC .......... *H01L 51/525* (2013.01); *H01L 27/322* (2013.01); *H01L 27/3246* (2013.01);
(Continued)

(58) Field of Classification Search
CPC ... H01L 51/525; H01L 51/5284; H01L 51/56; H01L 51/5218; H01L 51/5228;
(Continued)

(56) References Cited

U.S. PATENT DOCUMENTS 9,786,721 B1    10/2017   Tang
2014/0346477 A1*  11/2014   Chao ................. H01L 27/322
                                                257/40
(Continued)

FOREIGN PATENT DOCUMENTS

CN          203456466 U      2/2014
CN          103926735 A      7/2014
(Continued)

OTHER PUBLICATIONS

Chinese Office Action dated Jun. 4, 2019, from application No. 201810373842.X.
(Continued)

*Primary Examiner* — Shaun M Campbell
(74) *Attorney, Agent, or Firm* — Arch & Lake LLP (57) ABSTRACT

An organic light emitting display panel includes a cover plate and a back plate. The cover plate includes a cover plate glass on which three color films of R, G and B are formed. The cover plate includes an insulating cover layer covering the cover plate glass. The cover plate includes a BM area formed over the insulating cover layer and defining a pixel area. The cover plate includes a spacer pillar formed in the BM area. The cover plate includes an auxiliary cathode formed over the spacer pillar and the insulating cover layer. The back plate includes: an active layer array; a planarization layer formed on the active layer array, having a boss corresponding to the pixel area; and an OLED device formed on the boss.

10 Claims, 5 Drawing Sheets

(52) U.S. Cl.
CPC ...... *H01L 27/3258* (2013.01); *H01L 51/5284* (2013.01); *H01L 51/56* (2013.01); *H01L 51/5218* (2013.01); *H01L 51/5228* (2013.01); *H01L 2227/323* (2013.01); *H01L 2251/5315* (2013.01)

(58) Field of Classification Search
CPC ............... H01L 27/322; H01L 27/3246; H01L 27/3258; H01L 2227/323; H01L 2251/5315
See application file for complete search history.

(56) References Cited

U.S. PATENT DOCUMENTS

| | | | |
|---|---|---|---|
| 2016/0035803 A1* | 2/2016 | Kim | H01L 27/326 257/40 |
| 2016/0181566 A1* | 6/2016 | Wang | H01L 51/525 257/40 |
| 2017/0207416 A1* | 7/2017 | Kim | H01L 51/5012 |
| 2018/0122868 A1* | 5/2018 | Kim | H01L 27/322 |
| 2019/0067391 A1* | 2/2019 | Li | H01L 27/3246 |
| 2019/0305051 A1* | 10/2019 | Takahashi | H01L 27/3244 |

FOREIGN PATENT DOCUMENTS

| | | |
|---|---|---|
| CN | 205645816 U | 10/2016 |
| CN | 205900543 U | 1/2017 |
| CN | 107482044 A | 12/2017 |
| CN | 108598114 A | 9/2018 |
| JP | 2002-299044 A | 10/2002 |
| JP | 4262902 B2 | 5/2009 |

OTHER PUBLICATIONS

Chinese Office Action dated Nov. 19, 2019, from application No. 201810373842.X.
International Search Report and Written Opinion dated Jun. 6, 2019, from application No. PCT/CN2019/078564.

* cited by examiner

ORGANIC LIGHT EMITTING DISPLAY PANEL, MANUFACTURING METHOD THEREOF, AND DISPLAY DEVICE

CROSS REFERENCE TO RELATED APPLICATIONS

The present application is based upon International Application No. PCT/CN2019/078564, filed on Mar. 28, 2019, which is based upon and claims the priority of Chinese Patent Application No. 201810373842.X, filed on Apr. 24, 2018, the entire disclosure of which is hereby incorporated by reference.

TECHNICAL FIELD

The present disclosure relates to the field of display technologies, in particular, relates to an organic light emitting display panel, a manufacturing method thereof and a display device.

BACKGROUND

Top emission display technology is utilized to realize a large-size OLED 8K UHD display, which allows independent fabrication of a TFT back plate and a color film cover plate, and a back-end package pressing process.

In the process of packaging and pressing, firstly, a wall glue (Dam glue) with a certain thickness and width is sprayed along the periphery of a glass substrate. The thickness of the Dam glue and the air pressure at the time of packaging substantially determine the thickness between the upper and lower substrates of the panel. The gap between the upper and lower substrates is filled with a filler (Filler glue). Therefore, for the top emission display, the light emitted by the OLED device needs to pass through a thick Filler (5-7 µm), an insulating cover layer (OC layer), and a color filter layer (CF layer).

SUMMARY

The present disclosure provides an organic light emitting display panel with improved brightness, a manufacturing method thereof, and a display device including the display panel.

An aspect of the present disclosure provides an organic light emitting display panel including a cover plate and a back plate. The cover plate includes a cover plate glass on which three color films of R, G and B are formed, an insulating cover layer covering the cover plate glass, a BM area formed over the insulating cover layer and defining a pixel area, a spacer pillar formed in the BM area, and an auxiliary cathode formed over the spacer pillar and the insulating cover layer. The back plate includes an active layer array, a planarization layer formed on the active layer array and having a boss corresponding to the pixel area, and an OLED device formed on the boss.

In an implementation of the present disclosure, color films between adjacent sub-pixels in respective pixels overlap with each other.

In an implementation of the present disclosure, a width of the overlapping portion of the color films is 3-5 µm.

In an implementation of the present disclosure, the projection of the OLED device and the auxiliary cathode in a direction perpendicular to the display panel does not overlap or does not completely overlap; or the distance of the OLED device from the cover plate glass is less than or equal to the minimum distance of the auxiliary cathode from the cover plate glass; or the projection of the OLED device and the auxiliary cathode in a direction perpendicular to the display panel does not overlap or does not completely overlap and the distance of the OLED device from the cover plate glass is less than or equal to the minimum distance of the auxiliary cathode from the cover plate glass.

Another aspect of the present disclosure also provides a manufacturing method of a display panel. The method includes forming a cover plate and forming a back plate. Forming a cover plate includes: forming three color films of R, G and B on a cover plate glass; forming an insulating cover layer over the cover plate glass on which the three color films of R, Q and B are formed; forming a BM area over the insulating cover layer and defining a pixel area; forming a spacer pillar on the BM area; and depositing a metal layer on the spacer pillar and the insulating cover layer, and etching a trace to form an auxiliary cathode. Forming a back plate includes: forming a planarization layer over an active layer array, the planarization layer having a boss corresponding to the pixel area; and forming an OLED device on the boss.

In an implementation of the present disclosure, forming the planarization layer having the boss includes first forming a first planarization layer covering the active array, and then forming a second planarization layer over the first planarization layer corresponding to the pixel area to form the boss.

In an implementation of the present disclosure, forming the planarization layer having the boss includes forming a planarization layer covering the active array, and then removing a portion of the planarization layer corresponding to a non-pixel area to form the boss.

In an implementation of the present disclosure, color films between adjacent sub-pixels in respective pixels overlap with each other.

In an implementation of the present disclosure, the manufacturing method further includes packaging the back plate and the cover plate, after packaging the OLED device and the auxiliary cathode are offset from each other.

A third aspect of the present disclosure provides a display device including the display panel described above.

In the display panel of the present disclosure, the OLED device is provided on a boss, it can reduce the distance from the cover plate glass, and can effectively improve the brightness of the panel.

The Reference Numerals are as Follows:
1: Cover plate
11: Color film (CF)
12: Insulating cover layer (OC layer)
13: BM area (black matrix area)
14: Spacer pillar (PS)

15: Auxiliary cathode (AUX)
2: Back plate
21: Active layer array
22: Planarization layer
221: Boss
222: First planarization layer
23: OLED device
231: Anode
232: Organic functional layer
233: Cathode
24: Pixel definition layer

DETAILED DESCRIPTION

Example arrangements will now be described more fully with reference to the accompanying drawings. However, the example arrangements can be embodied in a variety of forms and should not be construed as being limited to the arrangements set forth herein. Rather, these arrangements are provided to make the present disclosure more complete and thorough, and to fully convey the concept of the example arrangements to those skilled in the art. In the figures, the thickness of the areas and layers are exaggerated for clarity. The same reference numerals in the drawings denote the same or similar structures, and thus their detailed description will be omitted.

Figure 1:
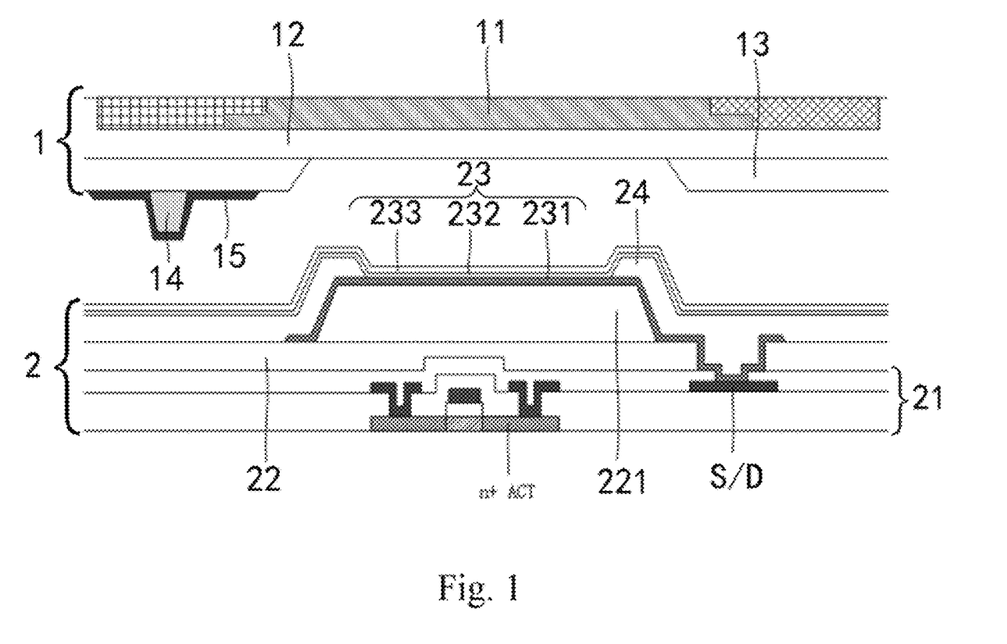
FIG. 1 is a schematic structural diagram of an organic light emitting display panel (before packaging) according to an arrangement of the present disclosure.

As shown in FIG. 1, an organic light emitting display panel includes a cover plate 1 and a back plate 2. The cover plate 1 includes: a cover plate glass, on which three color films 11 of R, G and B are formed; an insulating cover layer 12 covering the cover plate glass; a BM area 13 formed over the insulating cover layer 12; a spacer pillar 14 formed in the BM area 13; and an auxiliary cathode 15 formed over the spacer pillar 14 and the insulating cover layer 12. The color films of adjacent sub-pixels in respective pixels overlap with each other, and the width of the overlapping portion of the color films is 3-5 µm to avoid light leakage between the sub-pixels. The insulating cover layer 12 may be a glue material having a planarization effect, and the glue material may be a combination of one or more materials. The BM area 13 is formed over the insulating cover layer 12 and defines a pixel area. The spacer pillar 14 is made of an organic material. Compared with the related art in which the spacer pillar 14 is made on a metal material, since the BM area 13 is of an organic material and the roughness is higher, the base of the spacer pillar 14 has a stronger gripping force on the organic material. The auxiliary cathode 15 may be a metal layer formed over the spacer pillar 14 and the insulating cover layer 12, and formed after a trace is formed by etching.

The back plate 2 includes an active layer array 21, a planarization layer 22 covering the active layer array 21, an OLED device 23 and a pixel defining layer 24 formed over the planarization layer corresponding to the pixel area. The active layer array 21 may be a conventional active layer array, and may include, but is not limited to, a Gate & GI pattern, an ACT area, an S/D, and the like. The planarization layer 22 covering the active array 21 includes a boss 221, and the boss 221 may be formed by first forming a first planarization layer 222 and then forming a second planarization layer over the first planarization layer 222. Alternatively, the boss 221 may be formed by first forming a thicker planarization layer 21, and then removing a part of the planarization layer corresponding to the non-pixel area by exposure, development, or the like. The planarization layer 22 may be formed of an organic insulating dielectric material, which may include, but is not limited to, a material having a planarization effect such as a silicone-based material, an acrylic-based material, or a polyimide-based material. The OLED device 23 is formed within a pixel defining layer 24 that includes at least an anode 231, an organic functional layer 232, and a cathode 233. The organic functional layer 232 includes at least a light emitting layer, and may also include, but is not limited to, an electron injection layer, an electron transport layer, a hole injection layer, a hole transport layer, a barrier layer, and the like.

Figure 2:
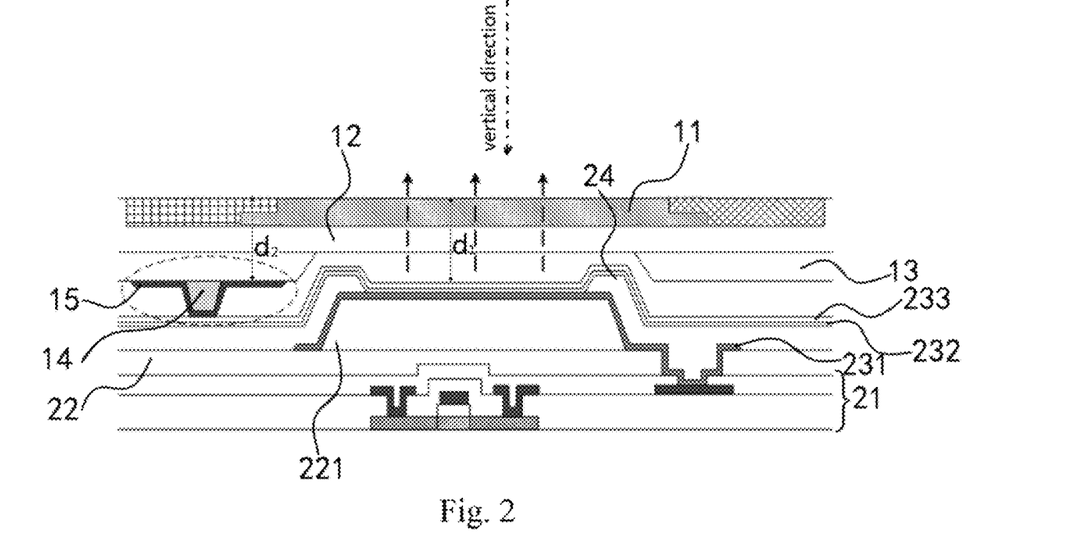
FIG. 2 is a schematic structural diagram of an organic light emitting display panel (after packaging) according to an arrangement of the present disclosure.

The cover plate 1 and the back plate 2 are packaged to form a display panel, as shown in FIG. 2. As can be seen from FIG. 2, the OLED device 23 is raised, having a distance from the cover plate 1 smaller than the distance of the OLED device from the cover plate in the conventional display panel, and the OLED device 23 and the auxiliary cathode 15 are offset from each other. The "offset" OLED device and auxiliary cathode in the present application means that the projection of the OLED device 23 and the auxiliary cathode 15 in the direction (vertical direction) perpendicular to the display panel does not overlap or does not completely overlap; or the distance d1 of the OLED device 23 from the cover plate glass is less than or equal to the minimum distance d2 of the auxiliary cathode 15 (i.e., the portion formed over the insulating cover layer 12) from the cover plate glass; or the projection of the OLED device 23 and the auxiliary cathode 15 in a vertical direction does not overlap or does not completely overlap and the distance d1 of the OLED device 23 from the cover plate glass is less than or equal to the minimum distance d2 of the auxiliary cathode 15 from the cover plate glass.

The electrodes and the trace metal of the organic light emitting display panel of the arrangements of the present disclosure may be commonly used metal materials such as Ag, Cu, Al, Mo, and the like, or multiple layers of metals such as Mo/Cu/Mo, or alloys materials of the above metals, such as AlNd, MoNb, and the like, or may also be stacked structures of metals and transparent conductive oxides (such as ITO, AZO, and the like), such as Mo/AlNd/ITO, ITO/Ag/ITO, and the like.

It can be seen from the structure of the organic light emitting display panel of the arrangement of the present disclosure that the organic light emitting display panel of the present disclosure is suitable for a manufacturing process of a top-emitting OLED display back plate based on TFTs of different structures, such as a device structure such as Top Gate, BCE, ESL, and the like, and suitable for TFTs with various oxides, silicon materials and organic materials as active materials. The active materials include a-IGZO, ZnON, IZTO, a-Si, p-Si, hexathiophene, polythiophene and other materials. That is, it is also suitable for top emission display back plates based on Oxide technology, silicon technology and organic technology.

Example 1

Figure 3:
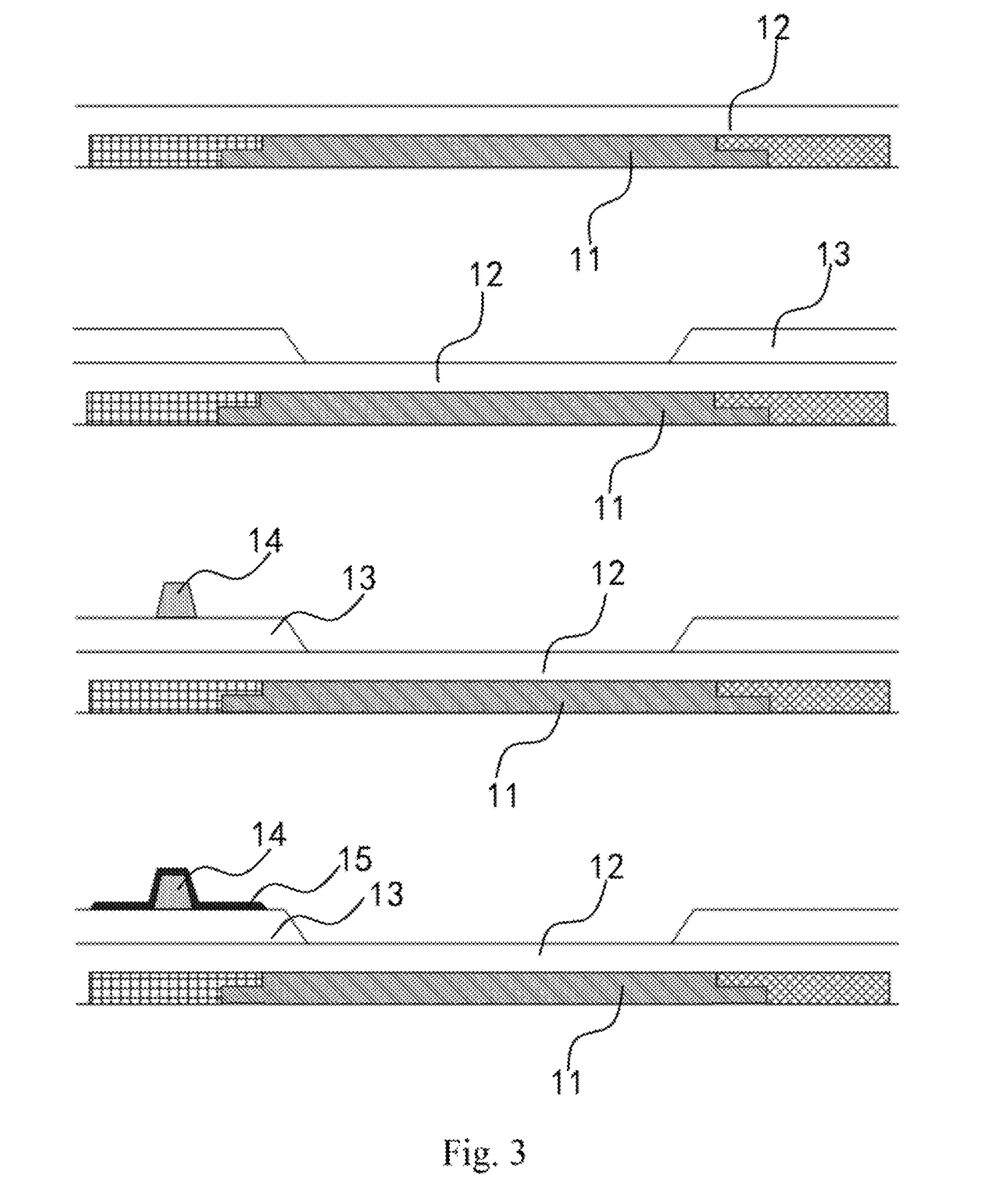
FIG. 3 is a flow chart showing the manufacture of the cover plate of Arrangement 1.
Figure 4:
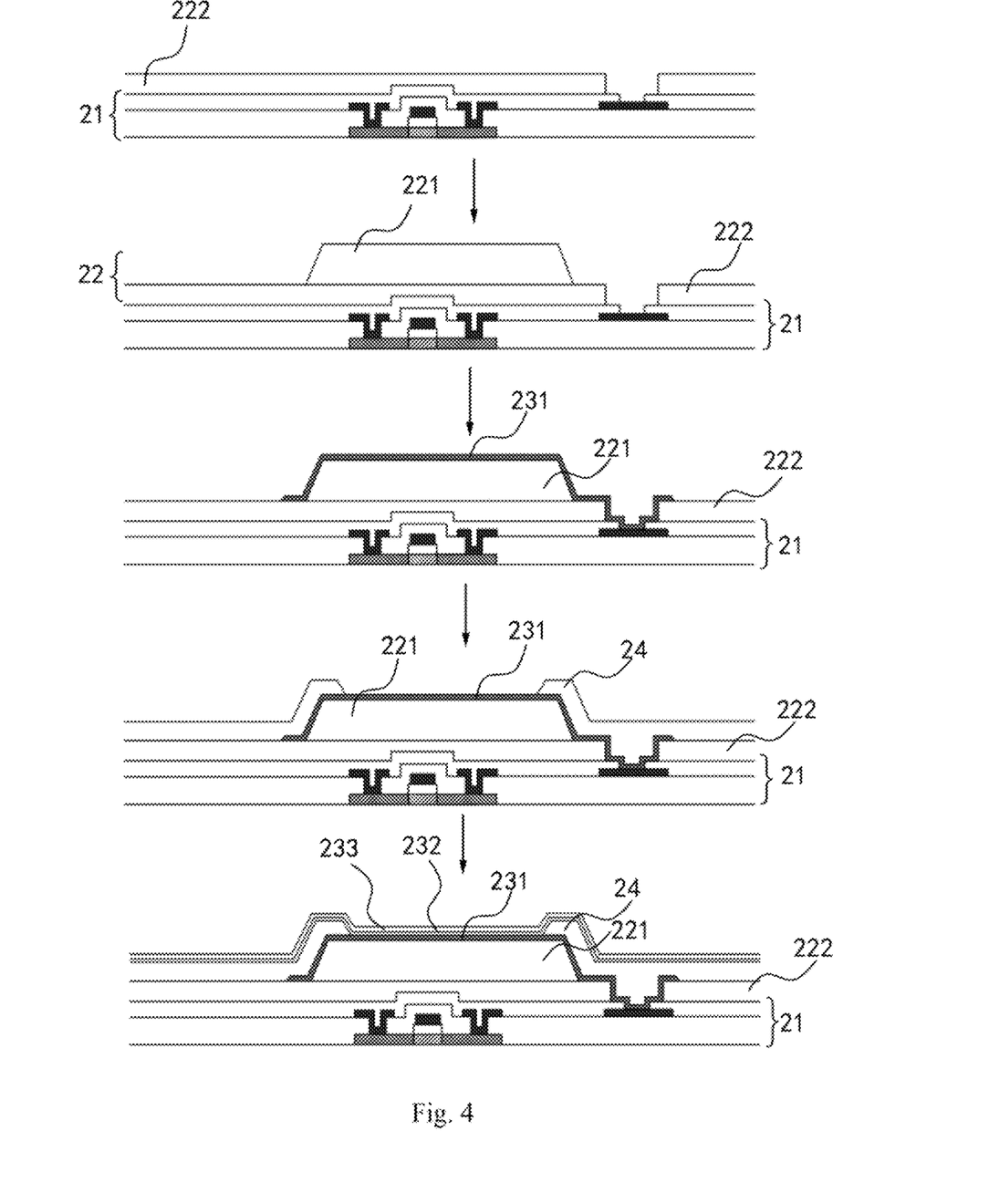
FIG. 4 is a flow chart (single sub-pixel) of the manufacture of the back plate of Arrangement 1.

The cover plate 1 and the back plate 2 are fabricated separately in conjunction with FIGS. 3 and 4.

As shown in FIG. 3, the forming process of the cover plate 1 is as follows.

After the initial cleaning of the cover plate glass, three color films 11 of R, Q and B are sequentially formed on the cover plate glass, and the color films between adjacent sub-pixels in respective pixels are overlapped. The width of the overlapping portion is 3-5 m.

An insulating material is coated to the entire surface of the cover plate glass on which the color film 11 is formed, to form an insulating cover layer 12.

A BM material is coated on the insulating cover layer 12 to form a BM area 13 and define a pixel area.

A PS material is coated on the BM area 13 to form a pillar PS 14 for supporting the upper and lower substrates.

An AUX metal layer is deposited on the PS 14 and the insulating cover layer 12, and the AUX trace is formed by etching, to form the auxiliary cathode 15.

As shown in FIG. 4, the forming process of the backing plate 2 is as follows.

The specific process of forming the active layer array 21 is: after the initial cleaning of the back plate, forming an active pattern on the back plate; continuously depositing a GI (gate insulating layer) and a gate layer, and forming a Gate & GI pattern with a gate mask by a self-assigning process; when dry-etching the GI, performing over-etching to make device source-drain electrode area (ACT area) conductive, such that the conductive ACT area may be taken as a trace and a capacitor plate (Vs); depositing an interlayer dielectric (ILD) layer and opening an ILD hole; depositing and patterning S/D (source/drain) metal; and performing plasma enhanced chemical vapor depositing (PECVD) of a passivation insulating layer (PVX).

A first organic planarization layer 222 is then formed, and a lower PVX layer is exposed by opening a hole on the first planarization layer 222. Then, the PVX layer is etched photolithographically again to form a via hole. A second planarization layer is formed over the first planarization layer 222 at a position corresponding to the pixel area of the cover plate 1. The second planarization layer forms an island-like boss 221.

An OLED device 23 is formed on the boss 221. First, the reflective anode metal is deposited and patterned to form an anode 231. A pixel defining layer (PDL) material is then coated to form a pixel defining layer 24 and defining a light emitting area.

The organic functional layers 232 of the OLED device are evaporated in the pixel defining layer 24. The transparent cathode material is then sputtered to form a cathode 233.

Finally, the formed cover plate 1 and back plate 2 are packaged to form a display panel.

Arrangement 2

Figure 5:
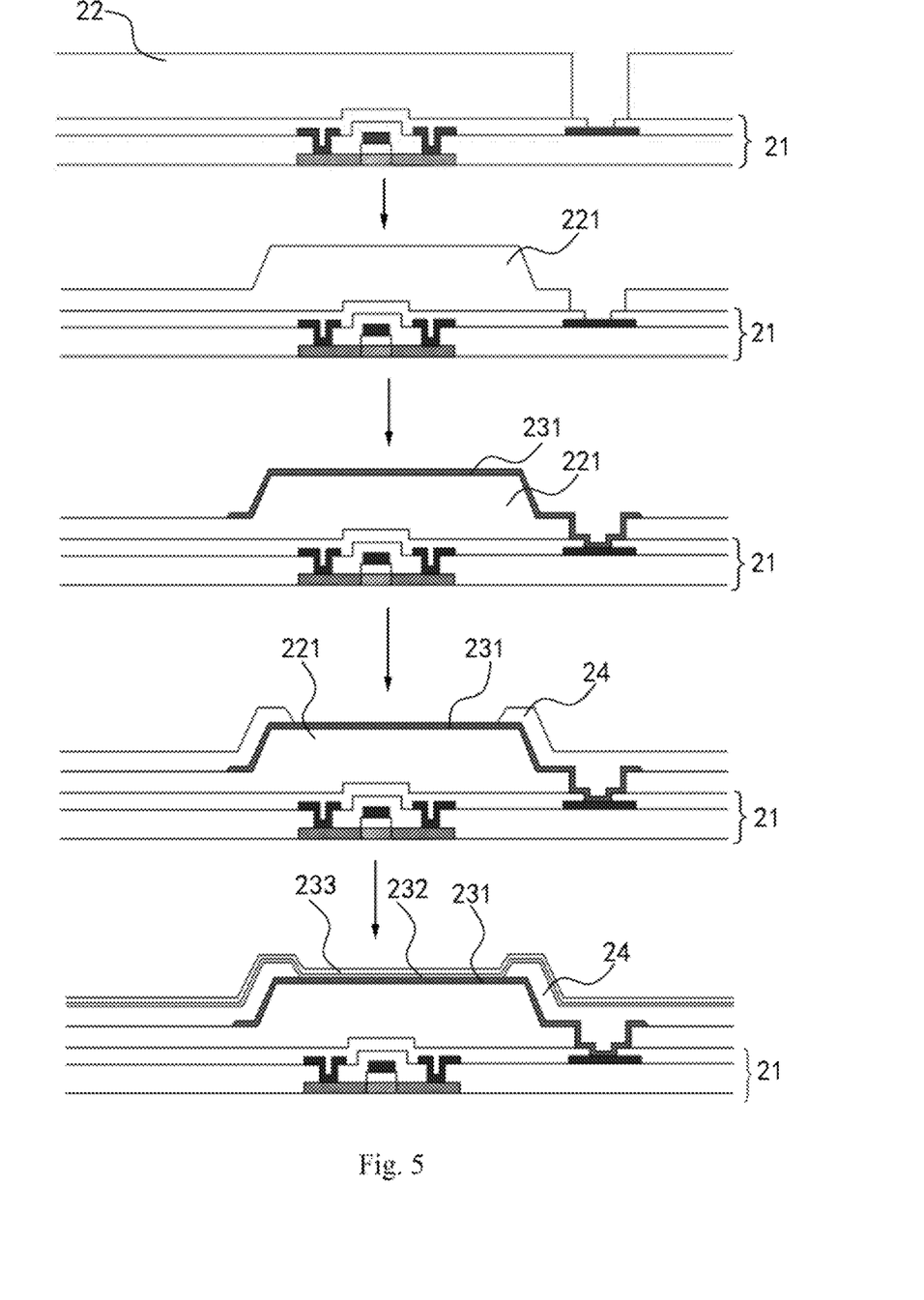
FIG. 5 is a flow chart (single sub-pixel) of the manufacture of the back plate of Arrangement 2.

The forming of the cover plate is the same as in the Arrangement 1, except that the forming process of the planarization layer 22 in the back plate is different from that of the Arrangement 1, the forming process of the other components is the same as that of the Arrangement 1.

As shown in FIG. 5, the forming process of the planarization layer 22 in the back plate 2 is as follows.

The planarization layer 22 is formed by spin coating a thick OC material (e.g., as an initial planarization layer), and then a via hole and a boss 221 are formed by one exposure development with a Half Ton Mask.

Finally, the formed cover plate 1 and back plate 2 are packaged to form a display panel.

Optionally, an arrangement of the present disclosure further provides a display device, which may include the above OLED display panel. The display device may be: a liquid crystal panel, an electronic paper, a mobile phone, a tablet computer, a television, a display, a notebook computer, a digital photo frame, a navigation device, and any product or component that has a display function.

In view of the above, in the organic light emitting display panel of the arrangements of the present disclosure, the OLED device is raised, and the distance from the OLED device to the cover plate glass after being pressed together is shortened. It can achieve the objective of improving the brightness of the panel. The structure of the back plate corresponding to the cover plate is correspondingly changed, thus avoiding light leakage of adjacent sub-pixels. It can achieve the technical effect of reducing the width of the BM line and increasing the aperture ratio; completely eliminating the light inside the panel, improving the reliability of the back plate; and increasing the adhesion of the PS and so on.

Of course, the present disclosure may have various other arrangements, and various corresponding changes and modifications may be made by those skilled in the art without departing from the spirit and scope of the disclosure. Such changes and modifications are intended to be included within the scope of the appended claims.

What is claimed is:

1. An organic light emitting display panel comprising a cover plate and a back plate, the cover plate comprising:
    a cover plate glass on which three color films of R, G and B are formed;
    an insulating cover layer covering the cover plate glass;
    a black matrix (BM) area formed over the insulating cover layer and defining a pixel area;
    a spacer pillar formed in the BM area; and
    an auxiliary cathode formed over the spacer pillar and the insulating cover layer;
    wherein the back plate comprises:
    an active layer array;
    a planarization layer formed on the active layer array, having a boss corresponding to the pixel area; and
    an organic light emitting diode (OLED) device formed on the boss;
    wherein projections of the OLED device and the auxiliary cathode in a direction perpendicular to the display panel do not overlap with each other; or a distance of the OLED device from the cover plate glass is less than or equal to a minimum distance of the auxiliary cathode from the cover plate glass; or the projections of the OLED device and the auxiliary cathode in the direction perpendicular to the display panel do not overlap or do not completely overlap with each other and the distance of the OLED device from the cover plate glass is less than or equal to the minimum distance of the auxiliary cathode from the cover plate glass.

2. The display panel according to claim 1, wherein color films between adjacent sub-pixels in respective pixels overlap with each other.

3. The display panel according to claim 2, wherein a width of an overlapping portion of the color films is from 3 micrometers ($\mu m$) to 5 $\mu m$.

4. A manufacturing method of a display panel, comprising forming a cover plate and forming a back plate, wherein forming a cover plate further comprises:
    forming three color films of R, G and B on a cover plate glass;
    forming an insulating cover layer over the cover plate glass on which the three color films of R, G, and B are formed;
    forming a black matrix (BM) area over the insulating cover layer and defining a pixel area;
    forming a spacer pillar on the BM area; and
    depositing a metal layer on the spacer pillar and the insulating cover layer, and etching a trace to form an auxiliary cathode; and
    wherein forming a back plate further comprises:
    forming a planarization layer over an active layer array, the planarization layer having a boss corresponding to the pixel area; and forming an organic light emitting diode (OLED) device on the boss;

wherein projections of the OLED device and the auxiliary cathode in a direction perpendicular to the display panel do not overlap with each other; or a distance of the OLED device from the cover plate glass is less than or equal to a minimum distance of the auxiliary cathode from the cover plate glass; or the projections of the OLED device and the auxiliary cathode in the direction perpendicular to the display panel do not overlap or do not completely overlap with each other and the distance of the OLED device from the cover plate glass is less than or equal to the minimum distance of the auxiliary cathode from the cover plate glass.

5. The manufacturing method according to claim 4, wherein forming the planarization layer having the boss is: first forming a first planarization layer covering the active layer array, and then forming a second planarization layer over the first planarization layer corresponding to the pixel area to form the boss.

6. The manufacturing method according to claim 4, wherein forming the planarization layer having the boss is: forming an initial planarization layer covering the active layer array, and then removing a portion of the initial planarization layer corresponding to a non-pixel area to form the boss.

7. The manufacturing method according to claim 4, wherein color films between adjacent sub-pixels in respective pixels overlap with each other.

8. A display device comprising an organic light emitting display panel comprising a cover plate and a back plate, the cover plate comprising:

a cover plate glass on which three color films of R, G and B are formed;

an insulating cover layer covering the cover plate glass;

a black matrix (BM) area formed over the insulating cover layer and defining a pixel area;

a spacer pillar formed in the BM area; and an auxiliary cathode formed over the spacer pillar and the insulating cover layer;

wherein the back plate comprises:

an active layer array;

a planarization layer formed on the active layer array, having a boss corresponding to the pixel area; and an organic light emitting diode (OLED) device formed on the boss;

wherein of the OLED device and the auxiliary cathode in a direction perpendicular to the display panel do not overlap with each other; or a distance of the OLED device from the cover plate glass is less than or equal to a minimum distance of the auxiliary cathode from the cover plate glass; or the projections of the OLED device and the auxiliary cathode in the direction perpendicular to the display panel do not overlap or do not completely overlap with each other and the distance of the OLED device from the cover plate glass is less than or equal to the minimum distance of the auxiliary cathode from the cover plate glass.

9. The display device according to claim 8, wherein color films between adjacent sub-pixels in respective pixels overlap with each other.

10. The display device according to claim 9, wherein a width of the overlapping portion of the color films is 3-5 µm.

* * * * *